(12) United States Patent
Hsu et al.

(10) Patent No.: US 8,279,686 B2
(45) Date of Patent: Oct. 2, 2012

(54) MEMORY CIRCUITS, SYSTEMS, AND METHODS FOR PROVIDING BIT LINE EQUALIZATION VOLTAGES

(75) Inventors: Kuoyuan Peter Hsu, San Jose, CA (US); TaeHyung Jung, Santa Clara, CA (US); Douk Hyoun Ryu, Lexington, MA (US); Young Suk Kim, Fremont, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 337 days.

(21) Appl. No.: 12/692,512

(22) Filed: Jan. 22, 2010

(65) Prior Publication Data

US 2010/0202220 A1    Aug. 12, 2010

Related U.S. Application Data

(60) Provisional application No. 61/151,230, filed on Feb. 10, 2009, provisional application No. 61/151,364, filed on Feb. 10, 2009.

(51) Int. Cl.
*G11C 7/00* (2006.01)

(52) U.S. Cl. .......... 365/189.11; 365/149; 365/190; 365/203

(58) Field of Classification Search .......... None
See application file for complete search history.

(56) References Cited

U.S. PATENT DOCUMENTS

| | | | | |
|---|---|---|---|---|
| 4,907,199 | A * | 3/1990 | Dosaka et al. | 365/189.04 |
| 4,943,952 | A * | 7/1990 | Terayama | 365/207 |
| 4,951,256 | A * | 8/1990 | Tobita | 365/208 |
| 5,499,211 | A * | 3/1996 | Kirihata et al. | 365/203 |
| 5,544,105 | A * | 8/1996 | Hirose et al. | 365/189.11 |
| 5,561,630 | A * | 10/1996 | Katoh et al. | 365/189.02 |
| 5,926,423 | A * | 7/1999 | Jeong | 365/201 |
| 5,973,983 | A * | 10/1999 | Hidaka | 365/230.03 |
| 6,205,067 | B1 * | 3/2001 | Tsukude | 365/201 |
| 6,272,037 | B1 | 8/2001 | Miyamoto | |
| 6,795,350 | B2 | 9/2004 | Chen et al. | |
| 7,085,187 | B2 * | 8/2006 | Koshikawa et al. | 365/229 |
| 7,260,006 | B2 * | 8/2007 | Lee | 365/203 |

FOREIGN PATENT DOCUMENTS

JP    6175739    6/1994

(Continued)

OTHER PUBLICATIONS

OA dated Feb. 21, 2012 from corresponding application No. 026699/2010.

(Continued)

*Primary Examiner* — Tan T. Nguyen

(74) *Attorney, Agent, or Firm* — Lowe Hauptman Ham & Berner, LLP

(57) ABSTRACT

A memory circuit includes at least one memory cell for storing a charge representative of a datum. The memory cell is coupled with a word line and a first bit line. At least one bit line equalization transistor is coupled between the first bit line and a second bit line. A bit line equalization circuit is coupled with the bit line equalization transistor. The bit line equalization circuit is configured for providing a pulse to the bit line equalization transistor to substantially equalize voltages of the first bit line and the second bit line during a standby period before an access cycle of the memory cell.

16 Claims, 7 Drawing Sheets

FOREIGN PATENT DOCUMENTS

| | | |
|---|---|---|
| JP | 07-057466 | 3/1995 |
| JP | 11-039874 | 2/1999 |
| KR | 1020090003623 | 1/1999 |
| KR | 10-0843793 | 7/2008 |
| WO | WO 01/93271 | 12/2001 |

OTHER PUBLICATIONS

OA dated Apr. 17, 2012 from corresponding application No. CN 201010116642.X.

OA dated Mar. 19, 2012 from corresponding application No. KR 10-2010-0012149.

* cited by examiner

MEMORY CIRCUITS, SYSTEMS, AND METHODS FOR PROVIDING BIT LINE EQUALIZATION VOLTAGES

CROSS-REFERENCES TO RELATED APPLICATIONS

The present application is based on, and claims priority from, U.S. Provisional No. 61/151,230 filed Feb. 10, 2009, the disclosure of which is hereby incorporated by reference herein in its entirety.

The present application is also related to U.S. Application No. 61/151,364, entitled "MEMORY CIRCUITS, SYSTEMS, AND OPERATING METHODS THEREOF," filed on Feb. 10, 2009, which is incorporated herein by reference in its entirety.

TECHNICAL FIELD

The present disclosure relates generally to the field of semiconductor circuits, and more particularly, to memory circuits, systems, and methods for providing bit line equalization voltages (BLEQs).

BACKGROUND

Memory circuits have been used in various applications. Memory circuits can include DRAM and SRAM circuits. A DRAM circuit includes a plurality of memory cells. For dynamic memory cells in which arrays of capacitive storage memory cells are provided, each memory cell has an access transistor. Data stored in such memory cells is actually a charge stored in a small capacitor. When the data is to be output, the access transistor is activated by a word line (WL) coupled to the gate or control terminal of the transistor. The access transistor then couples the capacitor to a bit line (BL) which, in turn, is coupled to a sense amplifier for sensing the voltage (charge) of the capacitor.

SUMMARY

In one or more embodiments, a memory circuit includes at least one memory cell for storing a charge representative of a datum. The memory cell is coupled with a word line and a first bit line of a bit line pair. At least one bit line equalization transistor is coupled between the first bit line and a second bit line of the bit line pair. A bit line equalization circuit is coupled with the bit line equalization transistor. The bit line equalization circuit is configured for providing a pulse to the bit line equalization transistor to substantially equalize voltages of the first bit line and the second bit line during a standby period before an access cycle of the memory cell.

In other embodiments, a method of accessing a memory circuit having at least one memory cell for storing a charge representative of a datum is provided. The method includes providing a pulse to at least one bit line equalization transistor coupled between a bit line pair to substantially equalize voltages of the bit line pair during a standby period before an access cycle of the memory cell.

These and other embodiments, as well as their features are described in more detail below with reference to the attached figures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
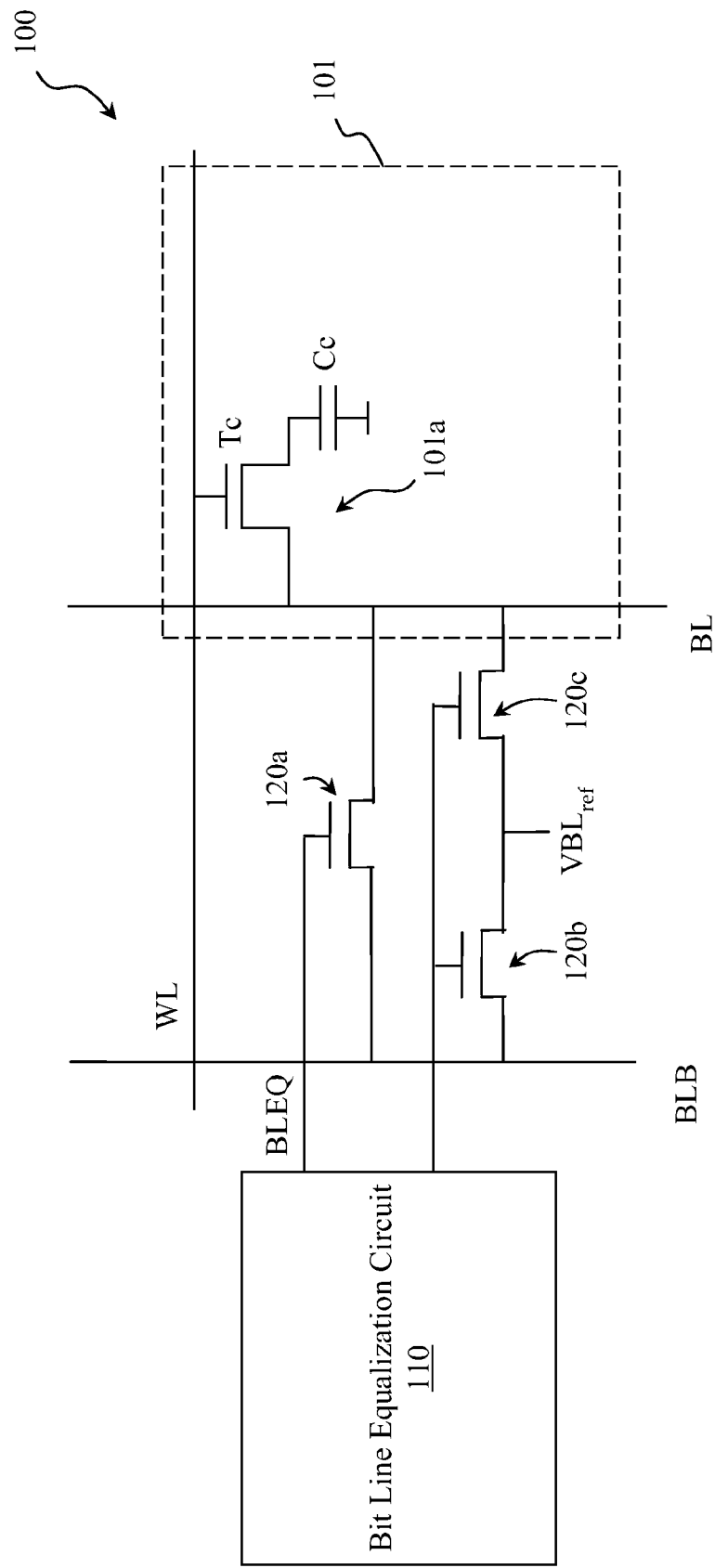
FIG. 1 is a schematic drawing illustrating an exemplary memory circuit.

A bit line equalization voltage BLEQ equal to VPP is applied to turn on bit line equalization transistors coupled between a bit line pair. It is found that when technology shrinks to 40 nm or less the power voltage VPP, e.g., an internal power voltage VDD+0.7 V, can result in leakage currents between gates and substrate of the bit line equalization transistors. The leakage currents waste power of the memory circuit. To reduce the leakage currents, the internal power voltage VDD is used as the bit line equalization voltage BLEQ to turn on the bit line equalization transistors. It is found that in the worst case scenario of Process-Voltage-Temperature (PVT) variations, the internal power voltage VDD may be too low to fully turn on the bit line equalization transistors. The non-fully turned-on bit line equalization transistors cause voltages of the bit line pair not substantially equalized. The voltage difference of the bit line pair may cause a sense amplifier to fail to sense data stored in the memory cell during an access cycle.

Based on the foregoing, memory circuits and operating methods thereof are desired.

It is understood that the following disclosure provides many different embodiments, or examples, for implementing different features. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Exemplary embodiments relate to memory circuits, systems, and methods for providing bit line equalization voltages (BLEQs). In one or more embodiments, the memory circuit can include a bit line equalization circuit that is capable of providing a pulse during a standby period to substantially equalize bit line pairs coupled with memory cells. For example, the pulse may rise from an internal voltage VDD to a power voltage VPP. By applying the internal voltage VDD as the bit line equalization voltage BLEQ during the standby period, gate-to-substrate leakage currents can be desirably reduced. During the standby period, the pulse rising from the internal power voltage VDD to the power voltage VPP can substantially equalize the voltages of the bit line pair. A sense amplifier coupled with the bit line pair can desirably detect the data stored in the memory cell, reducing sensing failures.

FIG. 1 is a schematic drawing illustrating an exemplary memory circuit. In FIG. 1, a memory circuit 100 can include a memory array 101 including a plurality of word lines and a plurality of bit lines. The memory circuit 100 can be a dynamic random access memory (DRAM) circuit, an embedded DRAM circuit, a static random access memory (SRAM) circuit, an embedded SRAM circuit, or other memory circuit. The memory array 101 can include at least one memory cell 101a. The memory cell 101a can be coupled with a bit line (BL) and a word line (WL) of the memory array 101. For embodiments using DRAM cells, the memory cell 101a can include a memory transistor ($T_c$) and a capacitor ($C_c$). The capacitor $C_c$ is capable of storing a charge representative of a datum, e.g., "0" or "1".

It is noted that though only one memory cell 101a is depicted, another cell (not shown) can be placed at the intersection of each of a plurality of word lines and the bit lines. A portion of the memory circuit 100 may have 8, 16, 32, 64, 128 or more columns that can be arranged in word widths. In one or more embodiments, the word lines can be laid out substantially orthogonally to the bit lines. In other embodiments, other arrangements of the word lines and bit lines can be provided.

Referring to FIG. 1, the memory circuit 100 can include at least one bit line equalization transistor such as bit line equalization transistors 120a-120c. The bit line equalization transistors 120a-120c can be coupled between the bit line BL and a bit line bar BLB. The bit line equalization transistors 120a-120c are configured to control bit line equalizations of the bit line BL and bit line bar BLB. In one or more embodiments, gates of the bit line equalization transistors 120a-120c can be coupled with a bit line equalization circuit 110. A node between the bit line equalization transistors 120b and 120c can be coupled with a bit line reference voltage $VBL_{ref}$. In one or more embodiments, the bit line reference voltage $VBL_{ref}$ can have a fixed $VBL_{ref}$/VDD ratio, e.g., ½, or an adjustable $VBL_{ref}$/VDD ratio. The application of the adjustable $VBL_{ref}$/VDD ratio is described in U.S. Patent Application Ser. No. 61/151,364 filed on Feb. 10, 2009, which is hereby incorporated by reference in its entirety. It is noted that the number of the bit line equalization transistors 120a-120c is a mere example. Various numbers of the bit line equalization transistors may be used.

In one or more embodiments, a sense amplifier (not shown) can be coupled with the bit line BL and bit line bar BLB. The bit line BL and bit line bar BLB can each further coupled to a global bit line GBL (not shown) and global bit line bar GBLB (not shown), respectively, through a use of a column select control line (not shown) and column select coupling transistors (not shown). In this manner, many columns of memory cells may be arranged in sub-arrays and selectively coupled to the global bit lines.

Following are descriptions regarding an access cycle of a memory cell. A dynamic memory can be refreshed periodically because the stored charge in the cells may leak away over time. Timing circuitry (not shown) can track the time elapsed since the last access to the memory cells and will cause the circuit to "refresh" the cells when desired. Refresh can be done, for example, by performing a read followed by a restore or "write back" cycle to the cells.

It is noted that any read of a memory cell of the memory cell 101a may result in charge leakages. The cell can be restored or rewritten at the end of the cycle. A "write" can be simply a read cycle with write data impressed on the respective local bit line during the "restore" portion of the cycle. For a write, the read data can be replaced or overwritten with the write data and then written into the cell. Thousands or even millions of these memory cells can be used to form a practical dynamic memory device.

Figure 2:
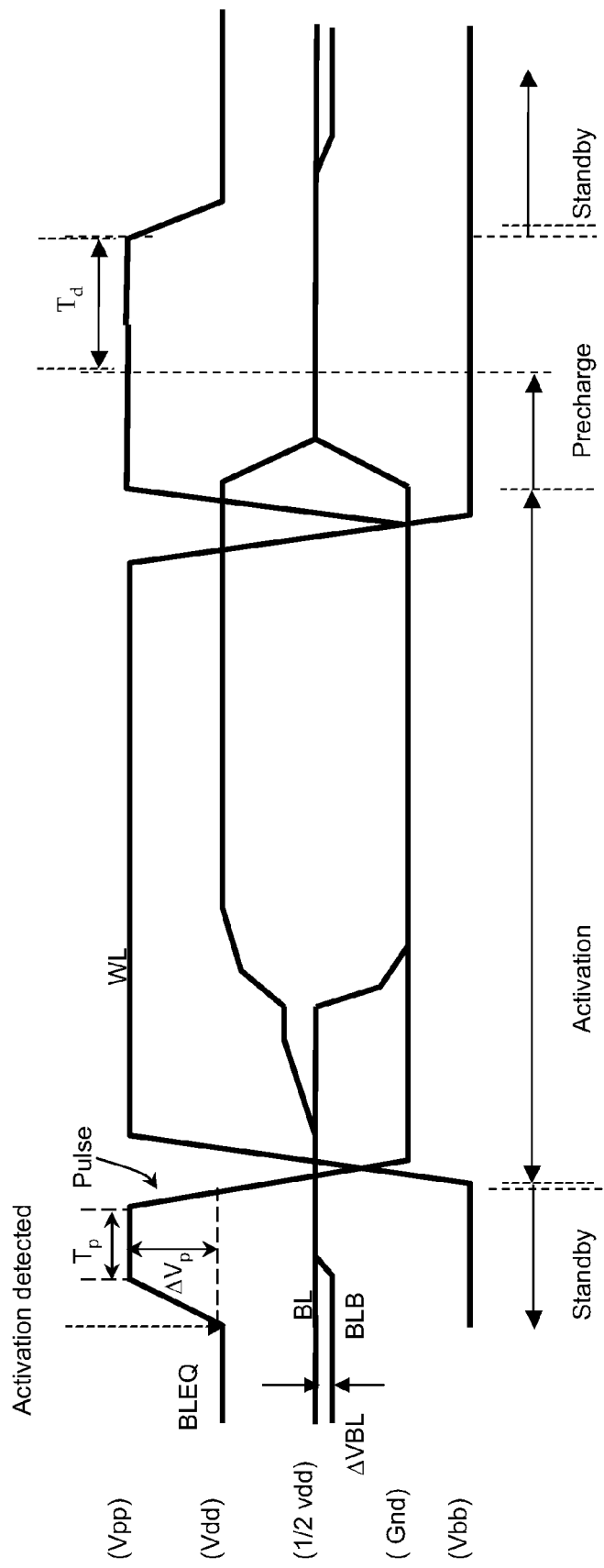
FIG. 2 is a schematic timing diagram illustrating non-continuous access to data of a memory cell.

In FIG. 2, an access cycle of the memory cell 101a (shown in FIG. 1) can include an activation period and a precharge period. In one or more embodiments where the memory cell 101a is not continuously accessed, a standby period can be added before the activation period to precharge the bit line BL and bit lie bar BLB. During the standby period, the bit line equalization circuit 110 (shown in FIG. 1) can provide a bit line equalization voltage BLEQ to the bit line equalization transistors 120a-120c (shown in FIG. 1). At the beginning of the standby period, the bit line equalization voltage BLEQ can be substantially equal to a power voltage such as an internal power voltage VDD. Under a normal operation, the internal power voltage VDD can be applied to the bit line equalization transistors 120a-120c, turning on the bit line equalization transistors 120a-120c to substantially equalize the voltages of the bit line BL and bit line bar BLB to the bit line reference voltage $VBL_{ref}$, i.e., ½ VDD. In one or more embodiments using a nominal voltage of about 0.9 V, the bit line equalization transistors 120a-120c may have a threshold voltage $V_{th}$ of about 0.47 V. In one or more embodiments, the memory cell 101a may fall within at a SSS corner of Process-Voltage-Temperature (PVT) variations with a low temperature of about −40° C., wherein the SSS corner represents that speeds of NMOS, PMOS, and the memory transistor $T_c$ of the memory circuit 100 are slow. At the SSS corner, the internal power voltage VDD may decline to around 0.765 V and the bit line reference voltage $VBL_{ref}$ may follow ½ VDD and change to around 0.383 V. It is found that the 0.765-V internal voltage VDD may not be able to fully turn on at least one of the bit line equalization transistors 120a-120c, resulting in a voltage difference ΔVBL (shown in FIG. 2) between the bit line BL and bit line bar BLB. The voltage difference ΔVBL may result in a sensing failure during the access cycle. However, the internal power voltage VDD may desirably reduce leakage currents of the bit line equalization transistors 120a-120c.

Referring again to FIG. 2, after an activation signal is detected the bit line equalization circuit 110 is capable of providing a pulse to the bit line equalization transistors 120a-120c during the standby period before the access cycle of the memory cell 101a. The pulse can desirably turn on the bit line equalization transistors 120a-120c, substantially equalizing the voltages of the bit line BL and bit line bar BLB to the bit line reference voltage $VBL_{ref}$, e.g., ½ VDD. In one or more embodiments, the activation signal is detected when a clock signal is active, a chip enable bar is detected, and a bank address is detected. In other embodiments, the array activation signal can include a read command, a write command, a bank address command, any activation command, and/or combinations thereof.

The pulse can have a voltage $\Delta V_p$ and a duration $T_p$. In one or more embodiments, the voltage $\Delta V_p$ can correspond to the voltage difference ΔVBL. For example, the voltage difference ΔVBL can be about 0.09 V. The voltage $\Delta V_p$ can be substantially equal to 0.09 V or more that is capable of substantially equalizing the voltages of the bit line BL and bit line bar BLB. In one or more embodiments using a 0.9-V nominal voltage, the voltage $\Delta V_p$ can be between about 0.09 V and about 0.7 V. In other embodiments, the voltage $\Delta V_p$ can be raised from the internal power voltage VDD to a power voltage VPP. The duration $T_p$ can be between about 200 picoseconds and about 500 picoseconds. In one or more embodiments, the duration $T_p$ can be about 300 picoseconds. The substantially equalized bit line BL and bit line bar BLB can desirably reduce the sensing failure resulting from the voltage difference ΔVBL. It is noted that the voltage $ΔV_p$ and the duration $T_p$ of the pulse described above are mere examples. One of skill in the art is able to modify the voltage $ΔV_p$ and the duration $T_p$ to substantially equalize the voltages of the bit line BL and bit line bar BLB.

As noted, the bit line equalization circuit 110 (shown in FIG. 1) is capable of providing the internal power voltage VDD during the standby period before the array activation signal is detected. Applying the internal power voltage VDD to the bit line equalization transistors 120a-120c can desirably reduce leakage currents between the gates and substrate of the bit line equalization transistors 120a-120c. If the array activation signal is detected, the bit line equalization circuit 110 is capable of providing the pulse to substantially equalize the voltages of the bit line BL and bit line bar BLB. The substantial equalization of the voltages of the bit line BL and bit line bar BLB may desirably avoid the sensing failure resulting from the voltage difference ΔVBL of the bit line BL and the bit line bar BLB.

Referring to FIG. 2, an activation period may follow the standby period. In the activation period, the word line WL can transit to a high positive voltage, e.g., VPP, to cause the transistor $T_c$ to couple the capacitor $C_c$ to the bit line BL. The word line WL can be coupled with an address decode circuit (not shown) that can determine which row in the memory array 101 is active based on an address previously supplied to the memory array 101. A short time after the word line WL goes active by transitioning to the positive voltage level, the access transistor $T_c$ can couple the capacitor $C_c$ of the memory cell 101a to the bit line BL. Coupling the capacitor $C_c$ of the memory cell 101a to the bit line BL can be referred to as a "charge sharing" portion. In the charge sharing portion, the bit line equalization circuit 110 can provide a low voltage such as VSS or ground, turning off the bit line equalization transistors 120a-120c. If data stored in the memory cell 101a is a logical "1", the capacitor $C_c$ can add a voltage to the bit line BL during the charge sharing operation. In response, a small voltage increase can be seen on the bit line BL. If the stored data is a logical "0", the capacitor $C_c$ may subtract a voltage from the bit line BL, for example, by charging the capacitor $C_c$ in the memory cell 101a from the bit line BL.

Shortly after the "charge sharing" portion, a sensing portion of the activation period may occur. In the sensing portion, the bit line equalization circuit 110 can be maintained at the low voltage such as a VSS or ground, turning off the bit line equalization transistors 120a-120c. The small differential input voltage from the selected memory cell 101a can be sensed by the sense amplifier SA (not shown) coupled with the bit line BL.

After the sensing portion, a restore portion may follow. In the restore portion, the bit line equalization circuit 110 may stay low such as a VSS or ground, turning off the bit line equalization transistors 120a-120c. In the restore portion of the cycle, the voltage of the bit line BL can increase from the voltage Vdd/2 (initial voltage on the bit line BL) plus the sensed differential voltage to a logical "1" high voltage or approximately the internal power voltage VDD. The voltage of the bit line bar BLB may be pulled down to a low voltage such as a VSS or ground. The bit line BL and the bit line bar BLB are at a logical "1" and a logical "0," respectively, that is at full logic voltage levels. Since the word line WL can still be kept high, the high voltage on the bit line BL can be coupled into the memory cell 101a. That is, the access transistor $T_c$ of the memory cell 101a can couple the high voltage to the capacitor $C_c$, restoring the stored charge for future accesses to the memory cell 101a.

After the activation period, a precharge period may occur as shown in FIG. 2. In the precharge period, the bit line equalization circuit 110 (shown in FIG. 1) may provide a power voltage such as VPP, turning on the bit line equalization transistors 120a-120c to substantially equalize the voltages of the bit line BL and the bit line bar BLB. The voltage of the word line WL can transition to a low voltage such as a VBB that may be lower than ground.

Referring again to FIG. 2, the bit line equalization circuit 110 is capable of pulling down the power voltage VPP to a voltage state such as the internal power voltage VDD if another array activation signal is not detected during the precharge period or a predetermined period $T_d$ after the precharge period. The predetermined period $T_d$ can be referred to as a time delay. In one or more embodiments, the predetermined period $T_d$ can be about 3 nanoseconds or other suitable time period. Sine no array activation signal is detected during the precharge period or the predetermined period $T_d$, the bit line equalization circuit 110 is capable of pulling down the power voltage VPP to the internal power voltage VDD, desirably reducing the leakage currents of the bit line equalization transistors 120a-120c.

Figure 3:
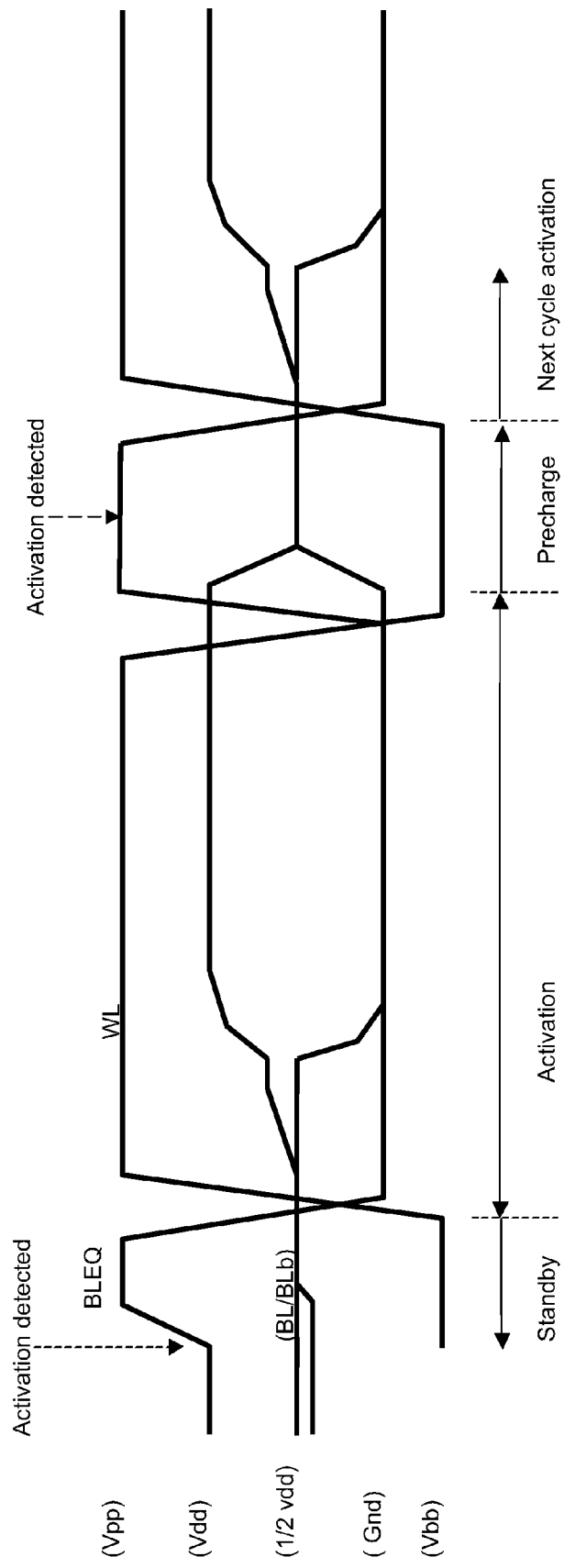
FIG. 3 is a schematic timing diagram illustrating continuous access to data of a memory cell.

In other embodiments, the bit line equalization circuit 110 is capable of pulling down the power voltage VPP to a voltage state such as ground that is lower than the internal power voltage VDD if another array activation signal is detected during the precharge period or the predetermined period $T_d$ after the precharge period (shown in FIG. 3). The detection of another array activation signal represents a continuous access of the data stored in the memory cell 101a. Since another array activation signal is detected during the precharge period or the predetermined period $T_d$ after the precharge period, the bit line equalization circuit 110 is capable of pulling the power voltage VPP to a low voltage such as a VSS or ground to turn off the bit line equalization transistors 120a-120c. The voltage of the word line WL can be pulled up to the power voltage VPP to turn on the transistor $T_c$ for continuously accessing the memory cell 101a.

Figure 4:
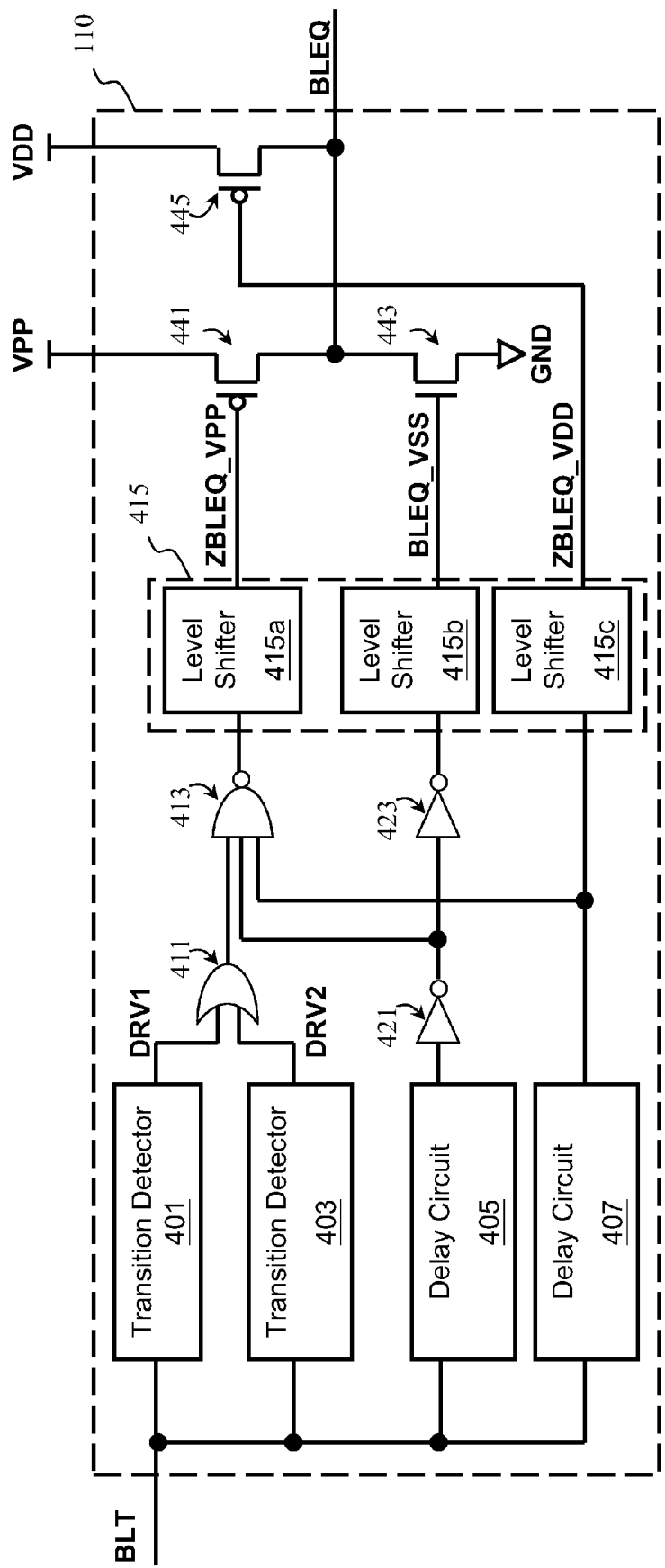
FIG. 4 is a schematic drawing showing an exemplary bit line equalization circuit.

FIG. 4 is a schematic drawing showing an exemplary bit line equalization circuit. In FIG. 4, the bit line equalization circuit 110 can include a first transition detector 401 such as a high-to-low transistor detector and a second transition detector 403 such as a low-to-high transistor detector. The transition detectors 401 and 403 are capable of detecting a state transition of an input end of the bit line equalization circuit 110. The bit line equalization circuit 110 can include a first logic gate 411 such as an OR logic gate coupled with output ends of the transition detectors 401 and 403. The first logic gate 411 is capable of performing a logic operation such as an OR logic operation for outputs of the transition detectors 401 and 403.

The bit line equalization circuit 110 can include a first delay circuit 405 such as a low-to-high delay circuit and a second delay circuit 407 such as a high-to-low delay circuit. The delay circuits 405 and 407 are capable of delaying state transition signals received at the input end of the bit line equalization circuit 110. The delay circuit 405 may provide a low-to-high transition delay between about 200 picoseconds and about 500 picoseconds. The delay circuit 407 may provide a high-to-low transition delay of about 3 nanoseconds. In one or more embodiments, the delay circuits 405 and 407 and the transition detectors 401 and 403 can be separate circuits.

In other embodiments, the delay circuits 405 and 407 may be incorporated within the transition detectors 403 and 401, respectively.

Referring to FIG. 4, the bit line equalization circuit 110 can include a first inverter 421 coupled with an output end of the delay circuit 405. The inverter 421 is capable of inverting the output of the delay circuit 405. A second logic gate 413 such as an NAND logic gate can be coupled with output ends of the logic gate 411, the inverter 421, and the delay circuit 407. The logic gate 413 is capable of performing a logic operation, e.g., an NAND logic operation, for the outputs of the logic gate 411, the inverter 421, and the delay circuit 407. The bit line equalization circuit 110 can include a second inverter 423 coupled with the output end of the inverter 421. The inverter 423 is capable of inverting the output of the inverter 421.

The bit line equalization circuit 110 can include at least one level shifter circuit 415 coupled with output ends of the logic gate 413, the inverter 423, and the delay circuit 407. The level shifter circuit 415 is capable of leveling a power voltage such as the internal power voltage VDD to another power voltage such as VPP. In one or more embodiments, the level shifter circuit 415 can include level shifters 415a-415c, each of the level shifters 415a-415c being coupled with an input of the logic gate 413 or the inverter 423 or the delay circuit 407. It is noted that the number of the level shifters 415a-415c shown in FIG. 4 is a mere example. Other arrangements are within the scope of this disclosure.

The bit line equalization circuit 110 can include a first one of a first type transistor 441 such as a PMOS transistor. The transistor 441 has a gate being coupled with a first output end of the level shifter circuit 415. In one or more embodiments, the gate of the transistor 441 is coupled with the output end of the level shifter 415a, and the transistor 441 can be coupled with a first power voltage such as VPP.

A first one of a second type transistor 443 such as an NMOS transistor. The transistor 443 has a gate being coupled with a second output end of the level shifter circuit 415. In one or more embodiments, the gate of the transistor 443 is coupled with the output end of the level shifter 415b. The transistor 443 can be coupled with a second power voltage such as a VSS or ground.

A second one of the first type transistor 445 can be, for example, a PMOS transistor. The transistor 445 has a gate being coupled with a third output end of the level shifter circuit 415. In one or more embodiments, the gate of the transistor 445 is coupled with the output end of the level shifter 415c. The transistor 445 can be coupled with a third power voltage such as the internal power voltage VDD. The transistors 441, 443, and 445 are coupled with an output end of the bit line equalization circuit 110 providing a bit line equalization voltage BLEQ. It is noted that the numbers and/or types of the detectors, delay circuits, logic gates, inverters, level shifter circuit, and transistors described above are mere examples. Other arrangements are within the scope of this disclosure.

Figure 5:
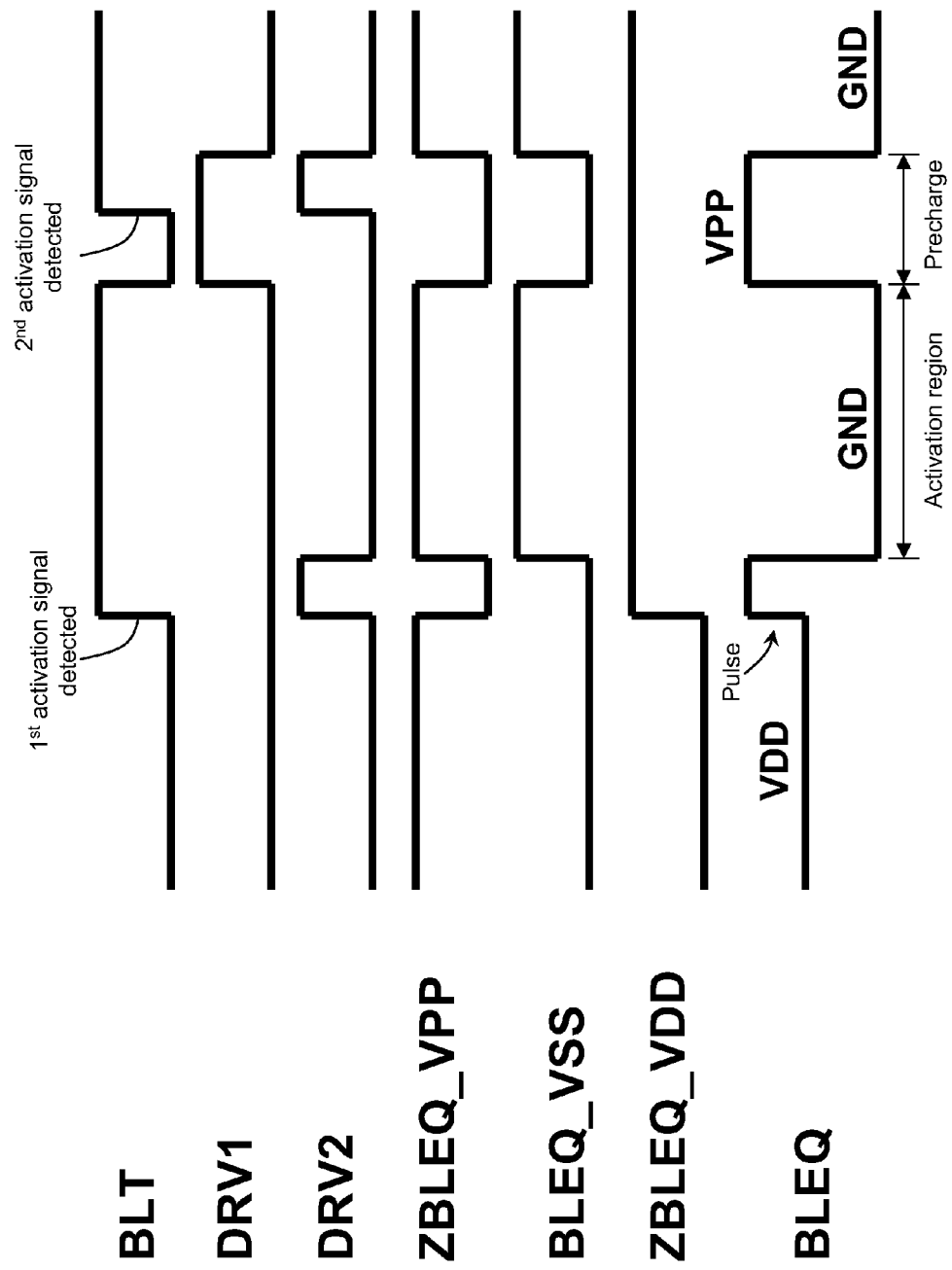
FIG. 5 is an exemplary BLEQ timing diagram illustrating continuous access to data of a memory cell.

Following are descriptions of exemplary operations of the bit line equalization circuit 110. FIG. 5 is an exemplary BLEQ timing diagram illustrating a continuous access of data of a memory cell. Referring to FIGS. 4 and 5, at the beginning no array activation signal is detected. The level shifter 415a can output a signal ZBLEQ_VPP with a high state, turning off the transistor 441. The level shifter 415b can output a signal BLEQ_VSS with a low state, turning off the transistor 443. The level shifter 415c can output a signal ZBLEQ_VDD with a low state, turning on the transistor 445. The turned-on transistor 445 can couple a power voltage such as the internal power voltage VDD with the output end of the bit line equalization circuit 110. The bit line equalization circuit 110 can provide the internal power voltage VDD to the bit line equalization transistors 120a-120c (shown in FIG. 1).

If an array activation signal is detected, the input (BLT) of the bit line equalization circuit 110 may transition from low to high. The level shifter 415a can output the signal ZBLEQ_VPP with a low state, turning on the transistor 441. The level shifter 415b can output the signal BLEQ_VSS with a low state, turning off the transistor 443. The level shifter 415c can output the signal ZBLEQ_VDD with a high state, turning off the transistor 445. The turned-on transistor 441 can couple a power voltage such as the power voltage VPP with the output end of the bit line equalization circuit 110. The bit line equalization circuit 110 can provide the power voltage VPP to the bit line equalization transistors 120a-120c (shown in FIG. 1).

As noted, if the array activation signal is detected the bit line equalization circuit 110 can provide a pulse, for example, arising from the internal voltage VDD to the power voltage VPP. The pulse may have a duration between about 200 picoseconds and about 500 picoseconds. As noted, applying the pulse arising from the internal power voltage VDD to the bit line equalization transistors 120a-120c can substantially equalize the voltages of the bit line BL and bit line bar BLB (shown in FIG. 1).

After the pulse, the activation period described above in conjunction with FIG. 3 may occur. The level shifter 415a can output the signal ZBLEQ_VPP with a high state, turning off the transistor 441. The level shifter 415b can output the signal BLEQ_VSS with a high state, turning on the transistor 443. The level shifter 415c can output the signal ZBLEQ_VDD with a high state, turning off the transistor 445. The turned-on transistor 443 can couple a power voltage such as a VSS or ground with the output end of the bit line equalization circuit 110.

After the activation period described above in conjunction with FIG. 3, the precharge period may follow. At the precharge period, the state of the input (BLT) of the bit line equalization circuit 110 transitions from high low. The level shifter 415a can output the signal ZBLEQ_VPP with a low state, turning on the transistor 441. The level shifter 415b can output the signal BLEQ_VSS with a low state, turning off the transistor 443. The level shifter 415c can output the signal ZBLEQ_VDD with a high state, turning off the transistor 445. The turn-on transistor 441 can couple a power voltage such as the power voltage VPP with the output end of the bit line equalization circuit 110.

If another array activation signal is detected during the precharge period or a predetermined period after the precharge period, the level shifter 415a can output the signal ZBLEQ_VPP with a high state, turning off the transistor 441. The level shifter 415b can output the signal BLEQ_VSS with a high state, turning on the transistor 443. The level shifter 415c can output the signal ZBLEQ_VDD with a high state, turning off the transistor 445. The turned-on transistor 443 can couple a power voltage such as ground with the output end of the bit line equalization circuit 110. Accessing the data stored in the memory cell can be continuous.

Figure 6:
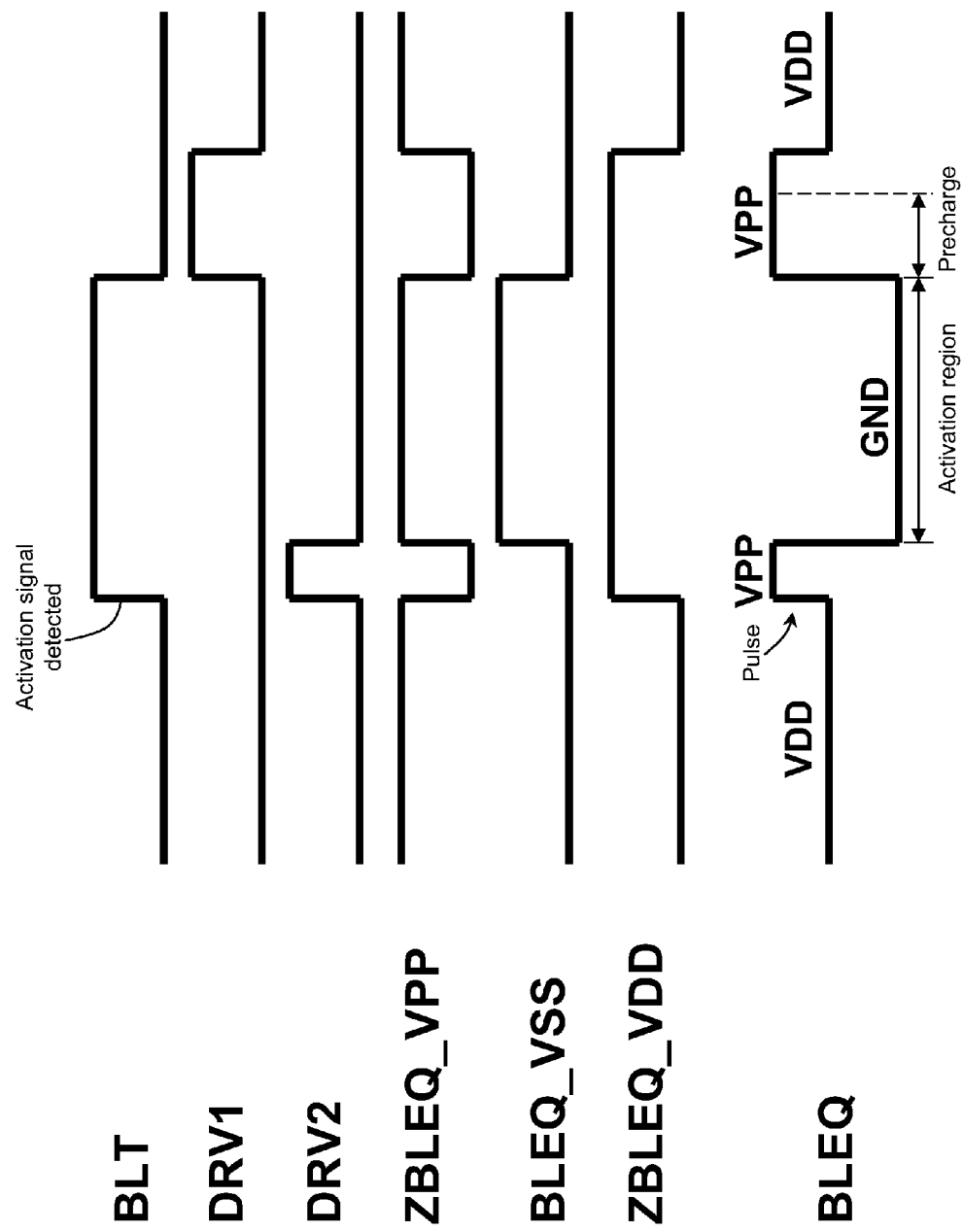
FIG. 6 is an exemplary BLEQ timing diagram illustrating non-continuous access to data of a memory cell.

In one or more embodiments, when the data stored in the memory cell is non-continuously accessed, no array activation signal is detected within the precharge period or the predetermined period after the precharge period as shown in FIG. 6. The level shifter 415a can output the signal ZBLEQ_VPP with a high state, turning off the transistor 441. The level shifter 415b can output the signal BLEQ_VSS with a low state, turning off the transistor 443. The level shifter 415c can output the signal ZBLEQ_VDD with a low state, turning on the transistor 445. The turn-on transistor 445 can couple the internal power voltage VDD with the output end of the bit line equalization circuit 110. Applying the internal power VDD as the bit line equalization voltage BLEQ to the bit line equalization transistors 120a-120c (shown in FIG. 1) can desirably reduce gate-to-substrate leakage currents of the bit line equalization transistors 120a-120c.

Figure 7:
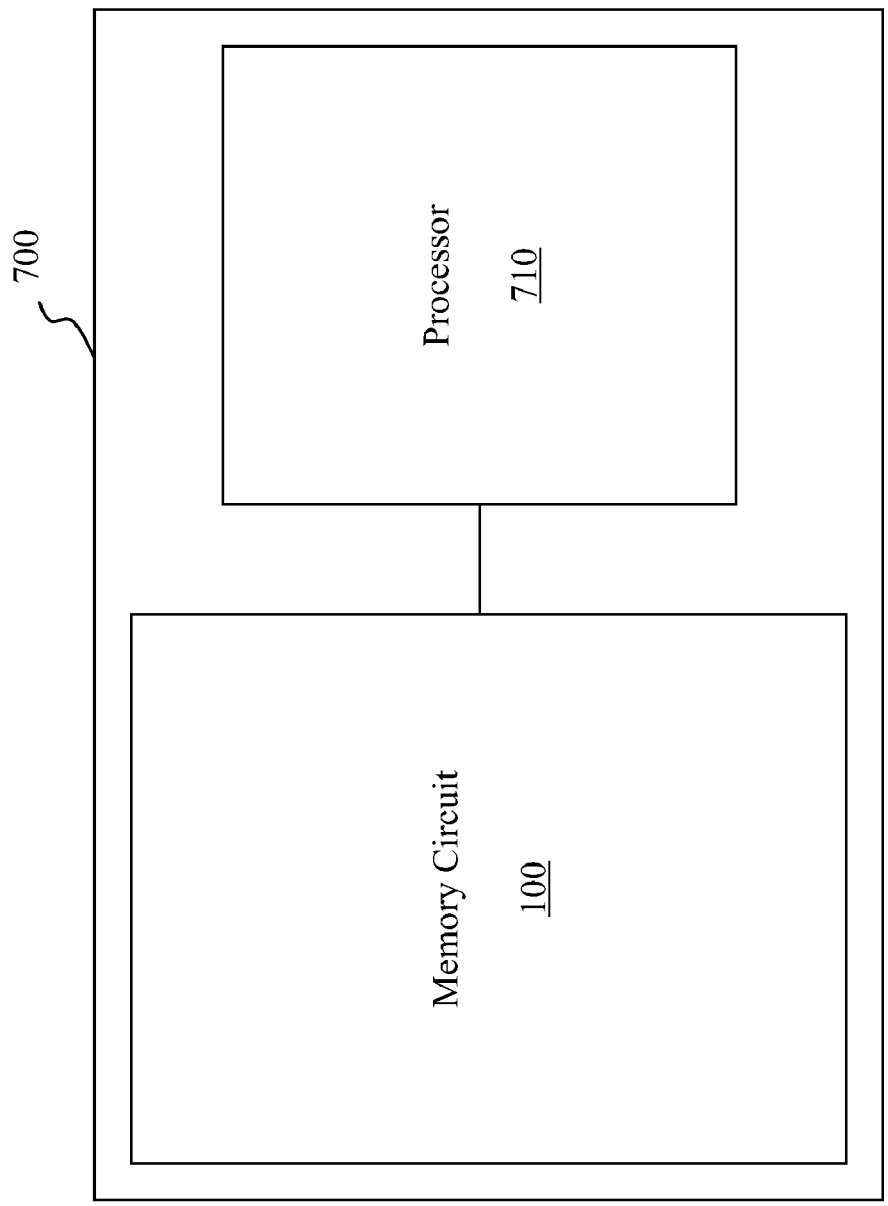
FIG. 7 is a schematic drawing showing a system including an exemplary memory circuit.

FIG. 7 is a schematic drawing showing a system including an exemplary memory circuit. In FIG. 7, a system 700 can include a processor 710 coupled with the memory circuit 100. The processor 710 is capable of accessing the datum stored in the memory cell 101a (shown in FIG. 1) of the memory circuit 100. In one or more embodiments, the processor 710 can be a processing unit, central processing unit, digital signal processor, or other processor that is suitable for accessing data of memory circuit.

In one or more embodiments, the processor 710 and the memory circuit 100 can be formed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In one or more embodiments, the system 700 including the memory circuit 100 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those ordinarily skilled in the art may better understand the aspects of the present disclosure. Those ordinarily skilled in the art should appreciate that they may readily use the present disclosure as a basis for designing or modifying other processes and structures for carrying out the same or similar purposes and/or achieving the same or similar advantages of the embodiments introduced herein. Those ordinarily skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
    at least one memory cell for storing a charge representative of a datum, the memory cell being coupled with a word line and a first bit line of a bit line pair;
    at least one bit line equalization transistor coupled between the first bit line and a second bit line of the bit line pair; and
    a bit line equalization circuit coupled with the bit line equalization transistor, the bit line equalization circuit being configured for
        providing a pulse to the bit line equalization transistor to substantially equalize voltages of the first bit line and the second bit line during a standby period before an access cycle of the memory cell,
        raising the pulse from a first power voltage to a second power voltage,
        providing the second power voltage during a precharge period of the access cycle of the memory cell, and
        pulling down the second power voltage to a voltage state,
    wherein
        the voltage state is lower than the first power voltage if an array activation signal is detected during the precharge period or during a predetermined period after the precharge period, and
        the voltage state is substantially equal to the first power voltage if the array activation signal is not detected during the precharge period and during the predetermined period after the precharge period.

2. The memory circuit of claim 1, wherein the predetermined period is about 3 nanoseconds.

3. The memory circuit of claim 1, wherein the pulse has a duration from about 200 picoseconds to about 500 picoseconds.

4. The memory circuit of claim 1, wherein the bit line equalization circuit comprises:
    a first transition detector for detecting a first transition of an activation signal;
    a second transition detector for detecting a second transition of the activation signal;
    a first logic gate coupled with output ends of the first and second transition detectors;
    a first delay circuit responsive to the first transition of the activation signal;
    a second delay circuit responsive to the second transition of the activation signal;
    a first inverter coupled with an output end of the first delay circuit;
    a second logic gate coupled with output ends of the first logic gate, the first inverter, and the second delay circuit;
    a second inverter coupled with the output end of the first inverter;
    at least one level shifter circuit coupled with output ends of the second logic gate, the second inverter, and the second delay circuit;
    a first transistor of a first type, the first transistor having a gate coupled with a first output end of the level shifter circuit, wherein the first transistor is coupled to receive a first power voltage;
    a second transistor of a second type, the second transistor having a gate coupled with a second output end of the level shifter circuit, wherein the second transistor is coupled with the first transistor; and
    a third transistor of the first type, the third transistor having a gate coupled with a third output end of the level shifter circuit, wherein the third transistor is coupled to receive a second power voltage.

5. A memory circuit, comprising:
    at least one memory cell for storing a charge representative of a datum, the memory cell being coupled with a word line and a first bit line of a bit line pair;
    at least one bit line equalization transistor coupled between the first bit line and a second bit line of the bit line pair; and
    a bit line equalization circuit coupled with the bit line equalization transistor, the bit line equalization circuit being configured for providing a pulse to the bit line equalization transistor to substantially equalize voltages of the first bit line and the second bit line during a standby period before an access cycle of the memory cell,
    wherein a voltage difference of the pulse corresponds to a voltage difference between the voltages of the first bit line and the second bit line.

6. The memory circuit of claim 5, wherein the voltage difference of the pulse is between about 0.1 V and about 0.7 V.

7. A memory circuit, comprising:
at least one memory cell for storing a charge representative of a datum, the memory cell being coupled with a word line and a first bit line of a bit line pair;
at least one bit line equalization transistor coupled between the first bit line and a second bit line of the bit line pair; and
a bit line equalization circuit coupled with the at least one bit line equalization transistor, wherein the bit line equalization circuit comprises:
a first transition detector;
a second transition detector coupled with the first transition detector;
a first logic gate coupled with output ends of the first and second transition detectors;
a first delay circuit coupled with the first and second transition detectors;
a second delay circuit coupled with the first and second transition detectors;
a first inverter coupled with an output end of the first delay circuit;
a second logic gate coupled with output ends of the first logic gate, the first inverter, and the second delay circuit;
a second inverter coupled with the output end of the first inverter;
at least one level shifter circuit coupled with output ends of the second logic gate, the second inverter, and the second delay circuit;
a first transistor of a first type, the first transistor having a gate coupled with a first output end of the level shifter circuit, wherein the first transistor is coupled to receive a first power voltage;
a second transistor of a second type, the second transistor having a gate coupled with a second output end of the level shifter circuit, wherein the second transistor is coupled with the first transistor; and
a third transistor of the first type, the third transistor having a gate coupled with a third output end of the level shifter circuit, wherein the third transistor is coupled to receive a second power voltage.

8. The memory circuit of claim 7, wherein the bit line equalization circuit is configured for providing a pulse to the bit line equalization transistor to substantially equalize voltages of the first bit line and the second bit line during a standby period before an access cycle of the memory cell.

9. The memory circuit of claim 8, wherein
a voltage difference of the pulse corresponds to a voltage difference between the voltages of the first bit line and the second bit line, and
the voltage difference of the pulse is between about 0.1 V and about 0.7 V.

10. The memory circuit of claim 8, wherein the bit line equalization circuit is configured for raising the pulse from the second power voltage to the first power voltage.

11. The memory circuit of claim 8, wherein the bit line equalization circuit is configured for raising the pulse from the second power voltage to the first power voltage.

12. The memory circuit of claim 8, wherein the pulse has a duration from about 200 picoseconds to about 500 picoseconds.

13. A method of accessing a memory circuit having at least one memory cell for storing a charge representative of a datum, the method comprising:
providing a pulse to at least one bit line equalization transistor coupled between a bit line pair to substantially equalize voltages of the bit line pair during a standby period before an access cycle of the memory cell;
raising the pulse from a first power voltage to a second power voltage;
providing the second power voltage to the at least one bit line equalization transistor during a precharge period of the access cycle of the memory cell; and
pulling down the second power voltage provided to the at least one bit line equalization transistor to a voltage state,
wherein
the voltage state is lower than the first power voltage if an array activation signal is detected during the precharge period or during a predetermined period after the precharge period, and
the voltage state is substantially equal to the first power voltage if the array activation signal is free from being detected during the precharge period and during the predetermined period after the precharge period.

14. The method claim 13, wherein a voltage difference of the first and second power voltages is between about 0.1 V and about 0.7 V.

15. The method claim 13, wherein the first power voltage is an internal power voltage VDD and the second power voltage is a power voltage VPP.

16. The method of claim 13, wherein the pulse has a duration from about 200 picoseconds to about 500 picoseconds.

* * * * *